US008363854B2

(12) United States Patent
Chou et al.

(10) Patent No.: US 8,363,854 B2
(45) Date of Patent: Jan. 29, 2013

(54) DEVICE AND METHOD FOR AUTOMATICALLY ADJUSTING GAIN

(75) Inventors: Kai-Hsiang Chou, Hsinchu (TW);
Wen-Haw Wang, Keelung (TW);
Yu-Heng Chen, Taipei (TW); Mei-Yu Fan, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 1091 days.

(21) Appl. No.: 12/253,751

(22) Filed: Oct. 17, 2008

(65) Prior Publication Data

US 2009/0103752 A1    Apr. 23, 2009

(30) Foreign Application Priority Data

Oct. 19, 2007   (TW) ............................... 96139263 A

(51) Int. Cl.
*H03G 3/00*   (2006.01)
(52) U.S. Cl. ........ 381/107; 381/104; 381/105; 381/106; 704/209; 704/226; 704/227
(58) Field of Classification Search .......... 381/104–109, 381/2, 56, 94.1, 94.2, 94.3; 704/200.1, 209, 704/226–227
See application file for complete search history.

(56) References Cited

U.S. PATENT DOCUMENTS

| 5,138,665 | A | 8/1992 | Ito |
| 5,574,792 | A | 11/1996 | Konno |
| 5,892,832 | A | 4/1999 | Beyer et al. |
| 7,877,253 | B2 * | 1/2011 | Krishnan et al. ............... 704/225 |
| 2009/0304190 | A1 * | 12/2009 | Seefeldt et al. .................. 381/56 |

FOREIGN PATENT DOCUMENTS

| CN | 101048935 A | 10/2007 |
| CN | 101089951 | 12/2007 |

OTHER PUBLICATIONS

Nathalie Virag, Single Channel Speech Enhancement Based on Masking Properties of the Human Auditory System, IEEE Transactions on Speech and Audio Processing., Mar. 1999, p. 126-137, vol. 7, No. 2, IEEE Signal Processing Society, USA.
English Abstract for CN 101089951 (Dec. 19, 2007).

* cited by examiner

*Primary Examiner* — Evan Pert
*Assistant Examiner* — Mark A Laurenzi
(74) *Attorney, Agent, or Firm* — McClure, Qualey & Rodack, LLP

(57) ABSTRACT

A device and method are provided for automatically adjusting gain, including a conversion module for converting an audio time-domain signal to an audio frequency-domain signal, an analysis module for analyzing the audio frequency-domain signal in accordance with an equal-loudness level contour of human hearing so as to generate strength weightings and generating a signal strength in accordance with the weightings, a calculation module for calculating a gain by analysis of the audio frequency-domain signal when the signal strength falls outside a default range, and a control module for generating an audio output signal in accordance with the gain and the audio time-domain signal.

23 Claims, 5 Drawing Sheets

DEVICE AND METHOD FOR AUTOMATICALLY ADJUSTING GAIN

CROSS-REFERENCES TO RELATED APPLICATIONS

This non-provisional application claims priority under 35 U.S.C. §119(a) on Patent Application No(s). 96139263 filed in Taiwan, R.O.C. on Oct. 19, 2007, the entire contents of which are hereby incorporated by reference.

BACKGROUND OF THE INVENTION

1. Field of the Invention

The present invention is generally related to devices and methods for adjusting gain, and more particularly, to a device and method for automatically adjusting gain.

2. Description of Related Art

There are various commercially available digital video systems or digital media players, such as digital video recorders (DVR), personal video recorders (PVR), MP3 players, voice recorders, and the like, for playing back audio signals. Specific sources of audio signals of digital video systems or digital media players include TV, files, disks, and other types of media. Switching between audio signals originating from different sources and played back by digital media players renders the output audio signals unstable due to discrepancies in audio signal sources and file formats.

One example from common experience is watching TV. A user who sets a TV set to a desirable volume level before watching a movie on the TV set expects a consistent output of audio signals of the movie being played on the TV set. Nonetheless, the user often perceives a sudden amplification of audio signals whenever the movie is interrupted by a television advertisement. This is because the audio signals of the movie are different from those of the television advertisement. As a result, an otherwise effortless movie watching session sees the user alternating between manually turning down the TV set when a TV advertisement appears and manually turning up the TV set when the TV advertisement disappears, causing the user inconvenience.

For this reason, U.S. Pat. No. 7,072,477 proposes a method and apparatus for automatically normalizing a perceived volume level in a digitally encoded file. The method includes the steps of selecting a number of frequency bands to calculate a gain factor for adjusting the output volume level and normalizing the output volume level. However, the method disclosed in U.S. Pat. No. 7,072,477 entails selecting appropriate frequency bands. Users may not know how to select appropriate frequency bands, and predetermined frequency bands may not match input audio signals. As a result the output audio signals do not meet the users' auditory needs, despite adjustment. Accordingly, the drawback of the prior art is an issue that calls for an immediate solution.

SUMMARY OF THE INVENTION

In light of the aforesaid drawback of the prior art, the present invention proposes a device and method for automatically adjusting gain. It is the primary objective of the present invention to select automatically, in real time and by analysis of spectral characteristics, a plurality of frequency bands most suitable for gain control in the presence of various audio signal sources so as to enable dynamic gain adjustment.

The present invention proposes a device for automatically adjusting gain, includes a conversion module, an analysis module, a calculation module and a control module. The conversion module converts an audio time-domain signal to an audio frequency-domain signal. The analysis module analyzes the audio frequency-domain signal in accordance with an equal-loudness level contour of human hearing so as to generate a signal strength. The calculation module calculates a gain by analysis of the audio frequency-domain signal when the signal strength falls outside a default range. The control module generates an audio output signal in accordance with the gain and the audio time-domain signal.

The present invention further proposes a method for automatically adjusting gain, including the steps of: converting an audio time-domain signal to an audio frequency-domain signal; analyzing the audio frequency-domain signal in accordance with an equal-loudness level contour of human hearing so as to generate a signal strength; calculating a gain by analysis of the audio frequency-domain signal when the signal strength falls outside a default range; and generating an audio output signal in accordance with the gain and the audio time-domain signal.

The invention will be better understood by reference to the following description read in conjunction with the accompanying drawings.

DETAILED DESCRIPTION OF THE EMBODIMENTS

Figure 1:
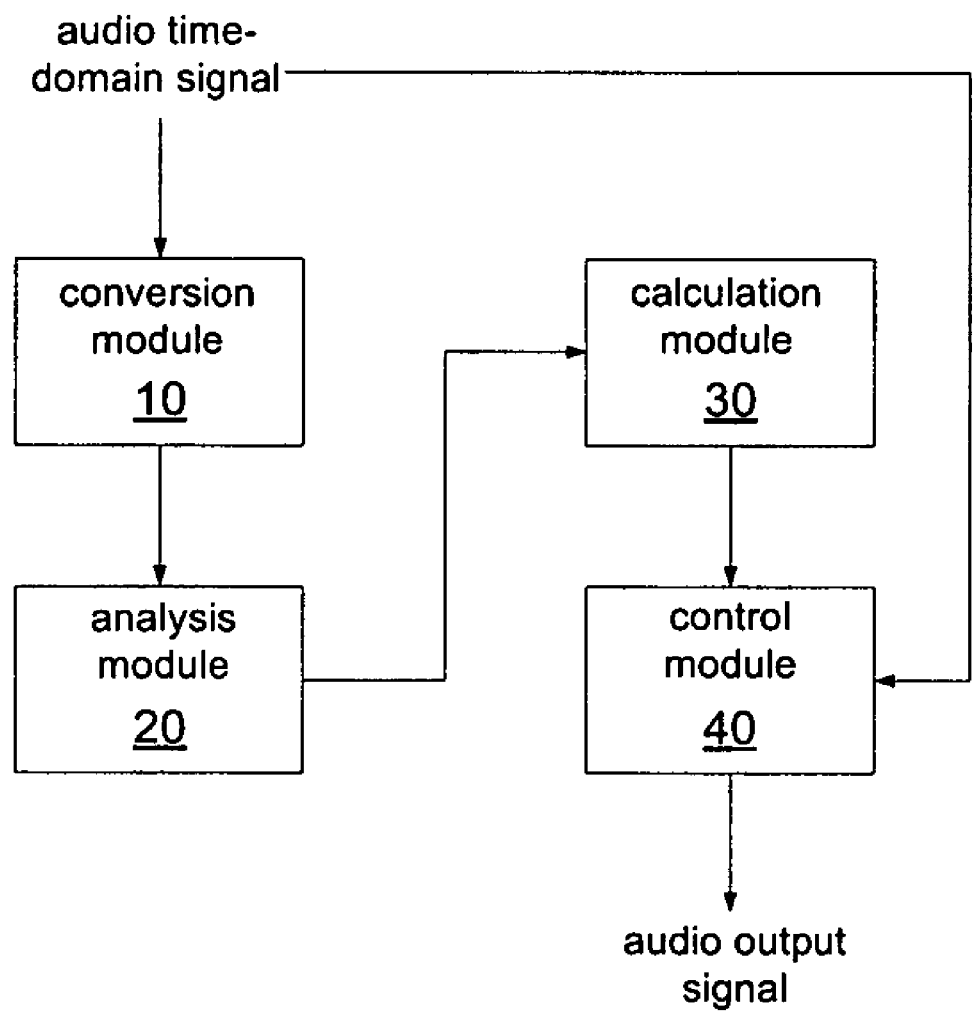
FIG. 1 is a schematic view of a first preferred embodiment of a device for automatically adjusting gain.

Please refer to FIG. 1, which is a schematic view of a first preferred embodiment of a device for automatically adjusting gain. The device for automatically adjusting gain includes a conversion module 10, an analysis module 20, a calculation module 30, and a control module 40.

An audio signal can be viewed from two different perspectives, namely from a time-axis perspective (i.e., time domain), and from a frequency-axis perspective (i.e., frequency domain). Time domain-based observation reveals amplitude of voice (sound intensity), and duration of voice. Upon the introduction of another audio signal of the same amplitude and duration of voice, the two voice signals are depicted as identical under time domain-based observation. Hence, the difference between different audio signals cannot be observed from a time-axis perspective. This is the reason why audio signals have to be observed from a second perspective, that is, frequency domain, which shows how audio signals vary with frequency and therefore enables the characteristics of the audio signals to be analyzed.

After receiving an audio signal, the conversion module 10 performs time-domain to frequency-domain conversion on the audio signal, that is, it converts an audio time-domain signal to an audio frequency-domain signal. Afterward, the analysis module 20 analyzes the audio frequency-domain signal in accordance with an equal-loudness level contour of human hearing so as to generate strength weightings, and generates a signal strength in accordance with the weightings.

At this point, it is necessary to point out that one of the essential technical features of the present invention is the equal-loudness level contour of human hearing. The description below starts with a calculation of sound pressure level (SPL). Sound intensity, which is the pressure of sound wave in the air, is expressed as sound pressure level (SPL) and usually measured in dyne/cm². When it comes to human ears, sound intensity is commonly known as "loudness". In practice, sound intensity is usually measured in decibels (dB), and the decibel value which compares two sound pressure levels is a measure of the sound pressure level of a sound relative to a predetermined reference sound pressure level $SPL_{ref}$. The reference sound pressure level represents the threshold of hearing by human ears, that is, the minimum sound pressure level required for perception of sound by human ears. While the threshold of hearing varies from person to person, the average threshold of hearing is generally defined as $SPL_{ref}$=0.0002 dyne/cm². The decibel (dB) is a logarithmic unit of measurement, because of the human perception of the wide variation of sound pressure level.

Figure 2:
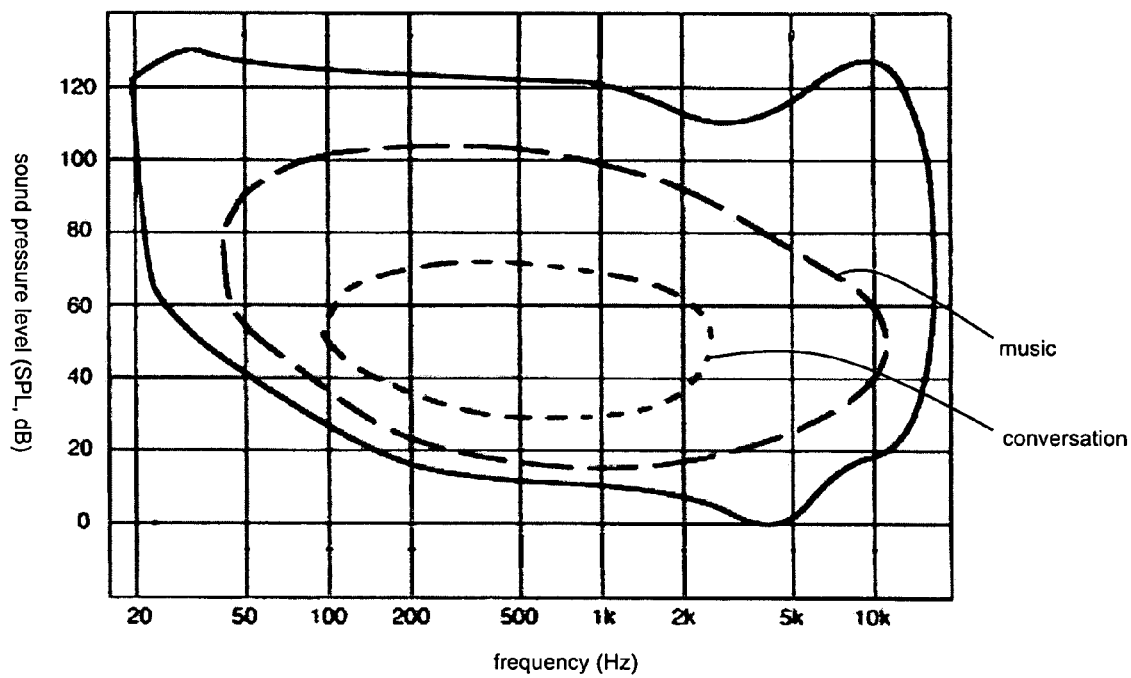
FIG. 2 is a distribution graph of sound intensity against frequency in daily life.

Please refer to FIG. 2, which is a distribution graph of sound intensity against frequency in daily life, the horizontal axis representing frequency (Hz), and the vertical axis representing sound pressure level (dB). As shown in the drawing, human beings engage in conversation of sound intensity ranging between approximately 30 dB and 70 dB, and listen to music of a sound intensity ranging between approximately 20 dB and 100 dB, whereas the upper and lower limits of sound pressure level and the frequency range of human hearing are denoted by the area enclosed with the outermost solid line. The outermost solid line of the drawing shows that the frequency range of human hearing is between 20 Hz and 20 KHz, but in reality, human ears are quite insensitive to high-frequency sound wave above 16 KHz.

Figure 3:
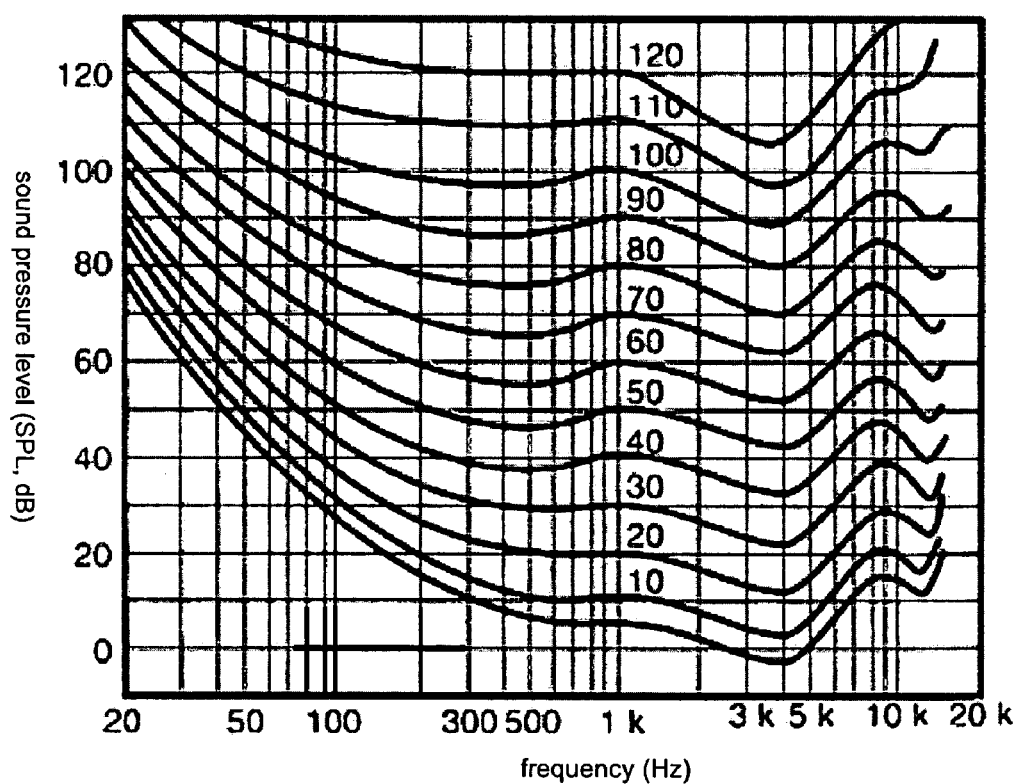
FIG. 3 is a graph of equal-loudness level contours of human hearing.

Please refer to FIG. 3, a graph of the equal-loudness level contours of human hearing. The previous FIG. 2 shows that equal-loudness is non-linear as far as human hearing is concerned; in other words, for human ears, the difference between the threshold of hearing and the threshold of feeling varies with sound frequency. The threshold of feeling refers to the sound pressure level that strains human ears after a period of time of perception of sound wave by human ears. Please refer to FIG. 3 again. Given a low sound pressure level, human ears are more sensitive to sound at the frequency band between 1 KHz and 5 KHz (and most sensitive to sound and with the least threshold of hearing at 4 KHz) than at other frequency bands. The sensitivity of human ears to low-frequency sound within the frequency band between 20 Hz and 200 Hz decreases with the frequency. Contours shown in FIG. 3 denote the distribution of equal-loudness sound pressure level (SPL, in dB) perceivable by human ears relative to a pure-tone sound wave at 1 KHz. For instance, at high sound pressure levels human ears perceive a sound at 110 dB SPL at 1 KHz as equivalent in loudness to a sound of approximately 120 dB SPL at 50 Hz, or a sound of approximately 118 dB SPL at 10 KHz. Likewise, at low sound pressure levels human ears perceive a sound of 50 dB SPL at 1 KHz as equivalent in loudness to a sound of approximately 75 dB SPL at 50 Hz, or a sound of approximately 55 dB SPL at 10 KHz.

As described earlier, human hearing is far from linear, and thus sound intensity perceivable by human ears varies in auditory perception even if sounds of the same sound pressure level are at different frequencies. Therefore, to enable users to perceive various output audio signals as steady and similar, the present invention proposes analyzing and adjusting gain based on the equal-loudness level contour of human hearing so as to optimize perception of sound by human ears.

Please refer to FIG. 1 again. Upon completion of time-domain to frequency-domain conversion performed on the audio signal by the conversion module 10, the analysis module 20 analyzes the audio frequency-domain signal in accordance with the equal-loudness level contour of human hearing so as to generate strength weightings. In other words, the audio frequency-domain signal is analyzed so as to obtain the frequency distribution or energy distribution of the audio frequency-domain signal, and then weights are assigned to the audio signals at different frequencies and with different energy levels based on the equal-loudness level contour of human hearing with a view to converting the audio frequency-domain signal into weighted strength. For instance, as shown in the graph of equal-loudness level contours of human hearing of FIG. 3, human ears are relatively insensitive to audio signals at high frequencies and low frequencies and therefore perceive the same degree of loudness only at a high sound pressure level; therefore, less weight is assigned to the audio frequency-domain signals at high and low frequencies. By contrast, human ears are relatively sensitive to audio signals at intermediate frequencies and therefore can perceive the same degree of loudness even at a low sound pressure level; hence, more weight is assigned to the audio frequency-domain signals at intermediate frequencies. In doing so, the acquired weighted strength enables users to perceive audio signals at whatever frequencies as steady and similar.

Acquisition of the strength weightings is followed by generation of a signal strength based on the acquired strength weightings. In an embodiment, a signal strength is generated by calculating power spectrum density (PSD) of the weighted strength. Power spectrum density is calculated with the equation: $X(\omega)=|FFT(X(n))|^2$, where $X(n)$ denotes audio signals. With Fast Fourier Transform or Discrete-time Fourier Transform, the square of the amplitude of each of the audio signals is calculated so as to obtain the power of the audio signals, that is, the signal strength disclosed in the present invention.

Upon determination that the signal strength falls outside a default range, the calculation module 30 calculates a gain by analysis of the audio frequency-domain signal. The default range lies between the maximum volume level perceivable by human ears and the minimum volume level perceivable by human ears. Considering that the range of perceivable volume levels varies from person to person, the present invention not only teaches predetermining a default range with the device for automatically adjusting gain according to the present invention but also discloses a default range that can be set programmable, default or user-defined.

The calculation module 30 automatically adjusts gain by analyzing spectral characteristics of audio frequency-domain signals in real time, and automatically selects a plurality of frequency bands most suitable for gain control in accordance with spectral characteristics of different types of audio signals when switching between different audio signal sources or facing a change in the types of audio signals, so as to enable dynamic adjustment of the frequency bands for calculating and controlling gain. As for selection of frequency bands, those frequency bands with concentrated spectral energy determine the signal strength to be generated by the analysis module 20.

For instance, since human voice is characterized by a spectrum that ranges mostly between 500 Hz and 2.5 KHz, talk shows should be broadcasted at an appropriate gain-controlling frequency band selected from voice frequencies (500 Hz~2.5 KHz). On the other hand, where audio input signals are switched to a music-only program, the resultant change of energy distribution necessitates selection of a new appropriate frequency band for gain control.

Finally, the control module 40 generates an audio output signal in accordance with the gain calculated by the calculation module 30 and the audio time-domain signal. The audio output signal is generated by multiplying the audio time-domain signal by the gain. The audio output signal is the audio signal eventually output to users. Note that the audio output signal is generated in accordance with the audio time-domain signal and the gain rather than the audio frequency-domain signal and the gain. This is because if the audio frequency-domain signal is multiplied by the gain, the characteristics of the audio output signal will change, turning a high-frequency audio signal into a low-frequency audio signal and vice versa. Consequently the audio output signals perceived by users are distorted and utterly different from the initial audio signals in tone. Hence, the audio time-domain signals have to be multiplied by the gain such that users do not perceive any distorted audio signals.

Figure 4:
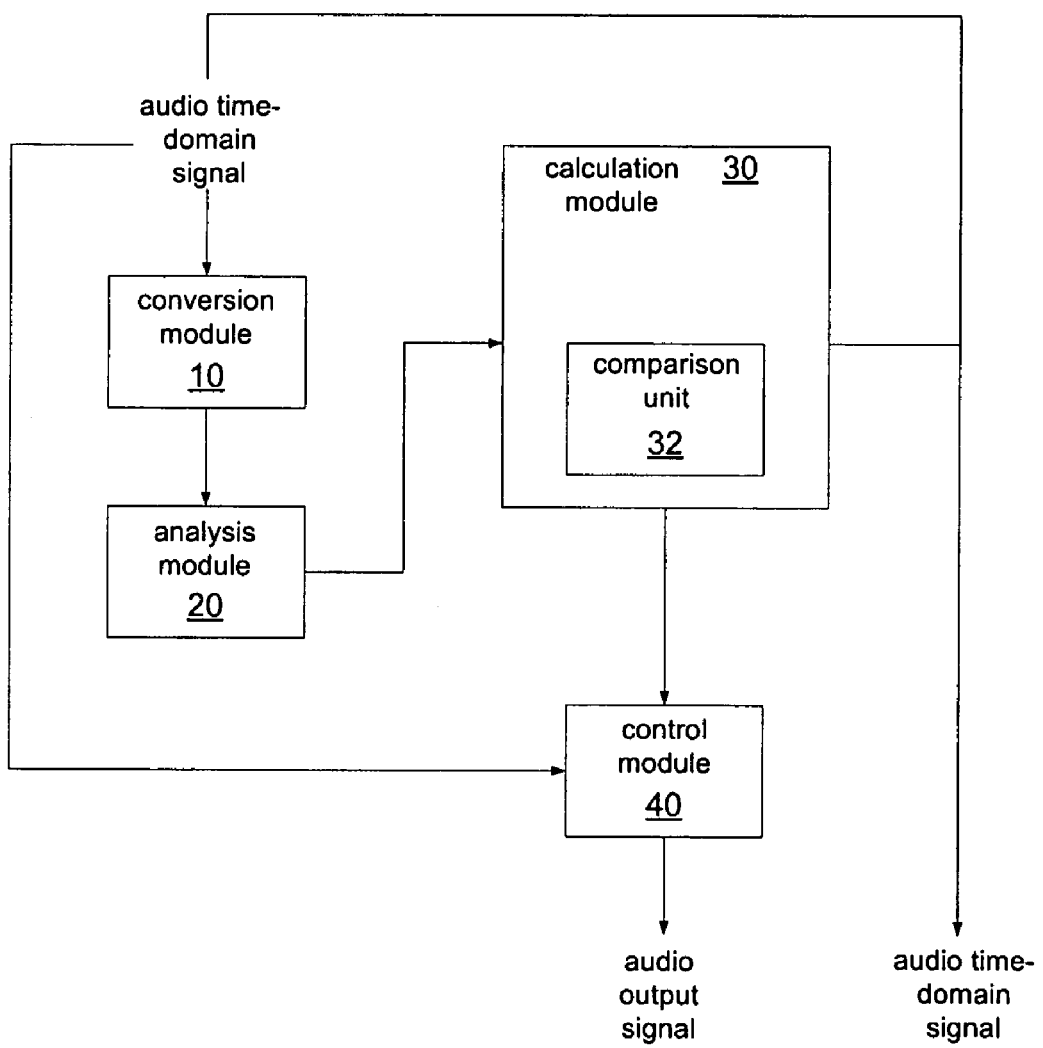
FIG. 4 is a schematic view of a second preferred embodiment of a device for automatically adjusting gain.

Please refer to FIG. 4, which is a schematic view of a second preferred embodiment of a device for automatically adjusting gain, in the second preferred embodiment, the calculation module 30 includes a comparison unit 32. The comparison unit 32 determines whether the signal strength generated by the analysis module 20 falls outside the default range. Where audio signals have a signal strength lying outside the default range, the signal strength of the audio signals has already gone beyond the range of signal strength perceivable by human ears. At this point, if the audio signals are not adjusted with a gain the unadjusted output audio signals will result in two scenarios. First, once signal strength goes beyond the maximum volume level perceivable by human ears, the output sound will be loud enough to irritate users' ears. Second, once signal strength drops below the minimum volume level perceivable by human ears, the output sound will be too soft to allow users to perceive the output audio signals. Therefore, once the comparison unit 32 determines that signal strength falls outside the default range, it will be necessary to calculate an appropriate gain with the calculation module 30 and adjust the audio output signals properly.

Conversely, where the comparison unit 32 determines that signal strength falls within the default range, it means that the signal strength of the audio signals falls within the range of signal strength perceivable by human ears, and thus it will not be necessary to adjust audio output signals with a gain. Therefore, once the comparison unit 32 determines that signal strength falls within the default range, it will be feasible to output the initial audio time-domain signal to users right away.

Furthermore, the audio frequency-domain signal includes a plurality of audio frames; in other words, to process and analyze an audio frequency-domain signal it is feasible to divide the audio frequency-domain signal into a plurality of audio frames and assign gains to the audio frames respectively so as to facilitate real-time analyze and adjustment. The calculation module 30 analyzes each of the audio frames in real time and calculates the gain corresponding to each of the audio frames. Finally, the control module 40 changes the gain for each of the audio frames by interpolation (linear interpolation or non-linear interpolation).

For instance, assume that processing of an audio frame is measured in n points, and that gain G1 is assigned to frame 1. Before processing frame 2, a calculation is performed using G1 to determine whether the next frame 2 will fall outside a default range. In response to an affirmative determination, gain G2 which prevents frame 2 from going beyond the default range is determined and changes the gain of frame 1 from G1 to G2 by interpolation within the n points, during the output of frame 1 at the nth point. The purpose of changing the gain gradually within the n points by interpolation is to allow changes of the gain to take place smoothly rather than stepwise (for example, where the gain is instantly changed from G1 to G2 only at the moment when frame 2 is output). In so doing, smooth transition of gain by interpolation allows users to perceive steady audio output signals.

Furthermore, where the comparison unit 32 determines that signal strength is beyond the maximum volume level perceivable by human ears, it is feasible to reduce the volume level of an audio signal quickly by a gain less than 1. The purpose of quick reduction of the volume level is to prevent an excessive output volume level which might otherwise harm human ears.

Conversely, where the comparison unit 32 determines that signal strength drops below the minimum volume level perceivable by human ears, it is feasible to increase the volume level of an audio signal slowly by a gain greater than 1. The purpose of slow increase of the volume level is to prevent users from perceiving unsteady output audio signals which otherwise occurs as a result of rapid increase of the volume level.

Furthermore, to preclude the possibility of improper amplification of noise, the control module 40 further sets an upper limit for preventing the gain from going beyond the upper limit. For instance, where users are watching a TV program that shows leading characters sleeping at night, when the signal strength of audio signals is analyzed, it is placed outside a default range, and in consequence the gain is calculated to amplify audio output signals. Since the initial audio signals are mute, the "amplified" audio output signals remain feeble no matter how great the adjusted gain is. Unless an upper limit is assigned to the gain to prevent the gain from being increased infinitely, any sudden event played in the TV program, such as an unexpected knock at the door, will bring a shocking outcome as a result of a combination of abrupt input of audio signals and a surge of gain. Accordingly, the present invention includes the control module 40 for controlling the upper limit of gain, such that the final gain is kept within the upper limit even after being processed on several successive occasions.

Figure 5:
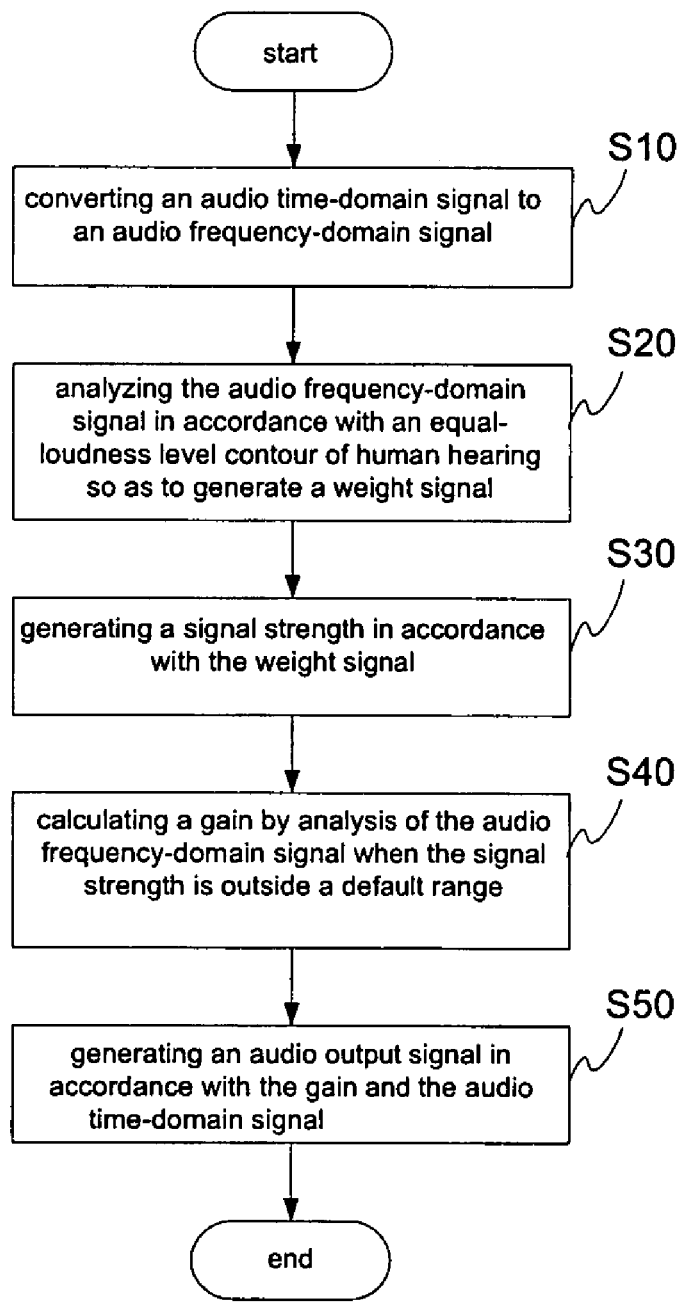
FIG. 5 is a flow chart of a method for automatically adjusting gain.

Please refer to FIG. 5, which is a flow chart of a method for automatically adjusting gain, the method for automatically adjusting gain includes the steps as follows.

Step S10: converting an audio time-domain signal to an audio frequency-domain signal. The time-domain to frequency-domain conversion is performed on the input audio signal so as to facilitate subsequent processing.

Step S20: analyzing the audio frequency-domain signal in accordance with an equal-loudness level contour of human hearing so as to generate strength weightings. Equal-loudness level contours of human hearing are suited to the actual needs of human hearing.

Step S30: generating signal strength in accordance with the strength weightings. The signal strength is generated by calculating the power spectrum density of the weighted strength.

Step S40: calculating gain by analysis of the audio frequency-domain signal when the signal strength falls outside a default range. The default range is programmable, default or user-defined. If the signal strength falls within the default range, the audio time-domain signal of S10 will be directly output to the user. S40 may also include the step of setting an upper limit for preventing the gain from going beyond the upper limit. In this way the gain is prevented from increasing infinitely.

Step S50: generating an audio output signal in accordance with the gain and the audio time-domain signal. The audio output signal is generated by multiplying the audio time-domain signal by the gain.

The audio frequency-domain signal includes a plurality of audio frames, which involves the steps of: analyzing each of the audio frames in real time so as to calculate the gain for the corresponding audio frame; and changing the gain for the corresponding audio frame by interpolation. In this way, variation of gain is smooth enough to allow users to perceive steady output of audio signals.

The embodiments described above are provided to demonstrate features of the present invention. The embodiments, however, are not intended to limit the scope of the present invention. Therefore, all equivalent changes or modifications performed by persons skilled in the art without departing from the spirit of the present invention should be encompassed by the scope of the invention. Thus, the protection of the disclosure should be defined by the appended claims.

What is claimed is:

1. A device for automatically adjusting gain, comprising:
    a conversion module, converting an audio time-domain signal to an audio frequency-domain signal;
    an analysis module, analyzing the audio frequency-domain signal in accordance with an equal-loudness level contour of human hearing so as to generate a signal strength;
    a calculation module, calculating a gain by analysis of the audio frequency-domain signal when the signal strength falls outside a default range; and
    a control module, generating an audio output signal in accordance with the gain and the audio time-domain signal.

2. The device for automatically adjusting gain of claim 1, wherein the signal strength is generated according to strength weightings.

3. The device for automatically adjusting gain of claim 2, wherein the signal strength is generated by calculating the power spectrum density of a weighted strength.

4. The device for automatically adjusting gain of claim 1, wherein the audio output signal is generated by multiplying the audio time-domain signal by the gain.

5. The device for automatically adjusting gain of claim 1, wherein the default range is programmable, default or user-defined.

6. The device for automatically adjusting gain of claim 1, wherein the calculation module comprises:
    a comparison unit, determining whether the signal strength falls outside the default range.

7. The device for automatically adjusting gain of claim 1, wherein the control module further sets an upper limit for preventing the gain from going beyond the upper limit.

8. The device for automatically adjusting gain of claim 1, wherein the audio frequency-domain signal comprises a plurality of audio frames.

9. The device for automatically adjusting gain of claim 8, wherein the calculation module analyzes the audio frames in real time so as to calculate the gain for the corresponding one of the audio frames.

10. The device for automatically adjusting gain of claim 9, wherein the control module changes the gain for the corresponding one of the audio frames by interpolation.

11. The device for automatically adjusting gain of claim 1, wherein the control module adjustably decreases the audio time-domain signal in accordance with the gain when the signal strength goes beyond a maximum volume level perceivable by human ears, the gain being less than 1.

12. The device for automatically adjusting gain of claim 1, wherein the control module adjustably increases the audio time-domain signal in accordance with the gain when the signal strength drops below a minimum volume level perceivable by human ears, the gain being greater than 1.

13. A method for automatically adjusting gain, comprising the steps of:
    converting an audio time-domain signal to an audio frequency-domain signal;
    analyzing the audio frequency-domain signal in accordance with an equal-loudness level contour of human hearing so as to generate a signal strength;
    calculating a gain by analysis of the audio frequency-domain signal when the signal strength falls outside a default range; and
    generating an audio output signal in accordance with the gain and the audio time-domain signal.

14. The method for automatically adjusting gain of claim 13, wherein the signal strength is generated according to strength weightings.

15. The method for automatically adjusting gain of claim 14, wherein the signal strength is generated by calculating the power spectrum density of a weighted strength.

16. The method for automatically adjusting gain of claim 13, wherein the audio output signal is generated by multiplying the audio time-domain signal by the gain.

17. The method for automatically adjusting gain of claim 13, wherein the default range is programmable, default or user-defined.

18. The method for automatically adjusting gain of claim 13 further comprising the step of:
    setting an upper limit for preventing the gain from going beyond the upper limit.

19. The method for automatically adjusting gain of claim 13, wherein the audio frequency-domain signal comprises a plurality of audio frames.

20. The method for automatically adjusting gain of claim 19 further comprising the step of:
    analyzing the audio frames in real time so as to calculate the gain for the corresponding one of the audio frames.

21. The method for automatically adjusting gain of claim 20 further comprising the step of:
    changing the gain for the corresponding one of the audio frames by interpolation.

22. The method for automatically adjusting gain of claim 13, wherein the audio time-domain signal is adjustably decreased in accordance with the gain when the signal strength goes beyond a maximum volume level perceivable by human ears, the gain being less than 1.

23. The method for automatically adjusting gain of claim 13, wherein the audio time-domain signal is adjustably increased in accordance with the gain when the signal strength drops below a minimum volume level perceivable by human ears, the gain being greater than 1.

* * * * *